United States Patent [19]

Caillat

[11] Patent Number: 5,681,647
[45] Date of Patent: Oct. 28, 1997

[54] ANISOTROPIC CONDUCTIVE FILM FOR MICROCONNECTIONS

[75] Inventor: Patrice Caillat, Echinolles, France

[73] Assignee: Commissariat a l'Energie Atomique, Paris, France

[21] Appl. No.: 538,343

[22] Filed: Oct. 3, 1995

[30] Foreign Application Priority Data

Oct. 28, 1994 [FR] France ................... 94 12961

[51] Int. Cl.$^6$ ........................... B32B 9/00
[52] U.S. Cl. .............. 428/209; 428/344; 428/354; 428/901
[58] Field of Search .................. 428/209, 901, 428/354, 344

[56] References Cited

U.S. PATENT DOCUMENTS

| | | | |
|---|---|---|---|
| 4,954,878 | 9/1990 | Fox et al. | |
| 5,060,844 | 10/1991 | Behum et al. | |
| 5,109,320 | 4/1992 | Bourdelaise | 428/901 |
| 5,232,548 | 8/1993 | Ehrenberg | 428/901 |
| 5,262,226 | 11/1993 | Yoshida | 428/209 |
| 5,304,460 | 4/1994 | Fulton et al. | |
| 5,374,469 | 12/1994 | Hino | 428/901 |
| 5,484,647 | 1/1996 | Nakatani | 428/209 |

FOREIGN PATENT DOCUMENTS

| | | |
|---|---|---|
| 0 308 980 | 3/1989 | European Pat. Off. |
| 0 327 399 | 8/1989 | European Pat. Off. |
| 0 560 072 | 9/1993 | European Pat. Off. |

Primary Examiner—Elizabeth Evans
Attorney, Agent, or Firm—Burns, Doane, Swecker & Mathis LLP

[57] ABSTRACT

This self-supported, anisotropic conductive film has a partly annealed polymer layer (46) containing through holes, nail-shaped conductive elements (51) filling said through holes, having a central portion and ends, and the central portion of the nails is made from a hard material (52) and each end respectively of a first and a second meltable materials (44, 54).

37 Claims, 4 Drawing Sheets

ANISOTROPIC CONDUCTIVE FILM FOR MICROCONNECTIONS

TECHNICAL FIELD

The present invention relates to the field of microconnections, where the problem arises of connecting an active or passive substrate to chips or integrated circuits. In order to bring about such a connection, four main method groups exist:

wire bonding, bonding the chip to an intermediate tape, known as tape automatic bonding or TAB, flip-chip, or brazing the input-output pads of the chip to the corresponding pads of the substrate by means of meltable microbosses also known as bumps, the bonding of the chip and the substrate with an intermediate, conductive, anisotropic film ensuring the electrical conduction in the direction Z, perpendicular to the surfaces of the chip and the substrate, and a good electrical insulation in a plane perpendicular to said direction Z.

From the standpoint of the contact quality obtained, the flip-chip method is that which is preferred due to the limitation of the connection length obtained. However, the process is long and expensive, because it requires at a minimum two dedicated lithography levels for defining the location of the bumps.

The anisotropic, conductive film concept to which the present invention relates is very interesting, because it obviates the dedicated lithography to each application.

A field of use of this procedure is e.g. that of flat screens, where it is necessary to make a connection between the silicon chips and the liquid crystal screens. The conductive film used is then usually a charged or filled epoxy glue, which, by crosslinking, contacts in the direction Z the conductive charges and the connection pads.

PRIOR ART

A first type of known anisotropic, conductive film is that illustrated in FIG. 1, where an electrical contact is established between a substrate 2 and a chip 4, respectively having contact pads 6, 8 and 10, 12, contact being ensured by means of a polymer matrix 14 having a high shrinkage on crosslinking and in which are embedded the bumps 16 having a gold or silver or nickel surface coating. Contact is obtained by crushing or flattening the bumps incorporated into the matrix 14, which either takes place mechanically from the outside, or is obtained by the crosslinking of the glue, which is then shrunk. In all cases, the contact resistance obtained is relatively high and in particular non-reproducible.

Another anisotropic, conductive film connection procedure is illustrated in FIG. 2, where references 2, 4, 6, 8, 10, 12 have the same meaning as in FIG. 1 and where the reference 20 designates the meltable bumps or bumps covered with a meltable material, incorporated into a polymer matrix 18 able to withstand high temperatures. By pressure and/or raising the temperature to several hundred degrees (e.g. 350° C.), the meltable material of the bumps melts, which makes it possible to establish contacts 22, 24 between the facing pads 6, 10 and 8, 12 of the substrate and the chip. It is pointed out that the structure shown in FIG. 2 is only a rough interpretation of what happens during the application of the high temperature and/or pressure. It is is very difficult to braze the bumps through the polymer film by mere pressure-heating, because the polymer present on the surface can rapidly prevent any correct soldering of the bumps to one another or to the pads. In most cases, the improvement resulting from this method is due to the high plasticity of the melting material which, on deforming, ensures the presence to a somewhat greater extent of an electric contact, which by other means is of a relatively poor quality.

Another procedure illustrated in FIG. 3 consists of depositing on the pads 10, 12 of the chip 4 a coating 26, 27 of a meltable material, and between the pads 6, 8 of the substrate 2 a polyimide coating 28. The two parts are then assembled by the application of a pressure and a temperature rise to approximately 350° C. The disadvantage is that it is necessary to have opening masks above the pads, in order to deposit on the one hand the meltable material and on the other the polyimide material. Thus, the universal side of the anisotropic conductive film is lost.

Finally, the vertical interconnection sheet or VIS method exists which, as illustrated in FIG. 4, consists of making a bond between the pads 10, 6 and 12, 8 by means of an etched polyimide film 30, in whose openings are deposited by electrolytic gold growth projecting "nails" 32. The problem is that the processes for obtaining the film with "nails" leads to spacings p between the nails which are relatively large, i.e. approximately 40 µm and that also the electrical connection by contact of the projecting gold nails does not permit a possible adhesion of the polyimide film to the surface of the chip. A similar process is described in U.S. Pat. No. 5 304 460 illustrated in FIG. 5 where, between the chip 4 and the substrate 2 is positioned an etched polymer film 34, in whose holes has been evaporated a meltable material 36. Then, by compression, the meltable material nails 36 are crushed on the pads 6, 10 and 8, 12, whose contact is to be ensured. In this procedure and as a function of the nature of the polymer, it is possible to obtain an adhesive action of the polymer on the surface of the pad to be contacted. However, this adhesive effect is only obtained on the surface of said pad and not between the pads "e.g. in the gaps 35, 37). Moreover, the preparation of the polymer in which is evaporated a meltable material for obtaining the nails must be performed beforehand on a support. It is then necessary to separate the polymer layer from this support without removing the meltable material 36, which presupposes a cold process. Finally, the bond remains of the "contact" type, because it is obtained by crushing nails on the pads and consequently, even with a meltable material, the contact remains mediocre.

DESCRIPTION OF THE INVENTION

The present invention proposes an anisotropic polymer film, whose separation is easy during its preparation and which ensures a better bond than the bond by contact during the assembly of a chip and a substrate.

The solution to these problems consists of producing in the film nails incorporating different materials having different melting points.

More specifically, the invention relates to a self-supported, anisotropic conductive film having a polymer layer containing through holes, nail-shaped conductive elements filling these through holes and having a central portion and ends, the central portion of the nails being made from a hard conductive material and each end respectively of a first and a second meltable materials.

Advantageously, the first and/or second materials project on either side of the polymer layer.

According to an embodiment of the invention, the first and second meltable materials are identical.

As will be explained hereinafter, this anisotropic, conductive film makes it possible to produce chip-substrate contacts with a low electrical resistance, a high mechanical strength and a good reliability.

The hard material can be constituted by copper or nickel or optionally some other meltable material. The meltable material can be SnPb.

The through holes can be spaced by between 3 and 500 μm and the diameter of the holes can vary from approximately 1 to 100 μm.

The production of the holes with such a small spacing makes it possible to obtain a "universal" anisotropic, conductive film, which can be adapted to different types of structures to be connected.

The present invention also relates to a process for producing an anisotropic conductive film like that described hereinbefore, said process being characterized in that:

on a substrate is deposited a layer of a first meltable material, a polymer layer is deposited on the layer of first meltable material, said polymer layer is annealed, through holes are formed in the polymer layer, a hard conductive material is deposited in the holes, a second meltable material is deposited on the hard material, heating takes place to a temperature equal to or above the melting point of the first meltable material and in this way the anisotropic conductive film is debonded from the substrate.

This process has the advantage of permitting an easy separation from the substrate of the anisotropic, conductive film formed. The first meltable material, which has no chemical affinity with the polymer, melts and permits an easy detachment of the film. Moreover, then a brazing of the meltable material on the hard material is obtained and consequently a nail structure which is mechanically very well installed in the detached film.

According to an embodiment of the invention, on said substrate and prior to the deposition of the layer of the first meltable material, is deposited an attachment or bonding layer of said first meltable material.

The two meltable materials can be identical.

Moreover, another aspect of the invention makes it possible to solve the problem of the partial character of the adhesive effect of the polymer between a substrate and a chip, in the case of a polymer according to the prior art. To solve this problem, the polymer annealing stage is a partial annealing. This ensures a creep of the polymer during assembly.

The invention also relates to a use of a film like that described hereinbefore, for connecting a chip and a substrate having in each case conductive pads and characterized in that:

the anisotropic conductive film is deposited on the substrate, so that the meltable material parts are in contact with the substrate pads, the chip is deposited on the conductive film in such a way that the meltable parts are in contact with the chip pads and so that the chip pads face those of the substrate, the assembly is annealed at a temperature permitting the brazing of the first and second meltable materials on the pads.

The order in which the deposition stages of the conductive film on the substrate and then on the chip can be reversed.

Other aspects of the invention can be gathered from the dependent claims.

BRIEF DESCRIPTION OF THE DRAWINGS

The invention is described in greater detail hereinafter relative to illustrative and non-limitative embodiments and the attached drawings, wherein show.

DETAILED DESCRIPTION OF EMBODIMENTS

Figure 1:
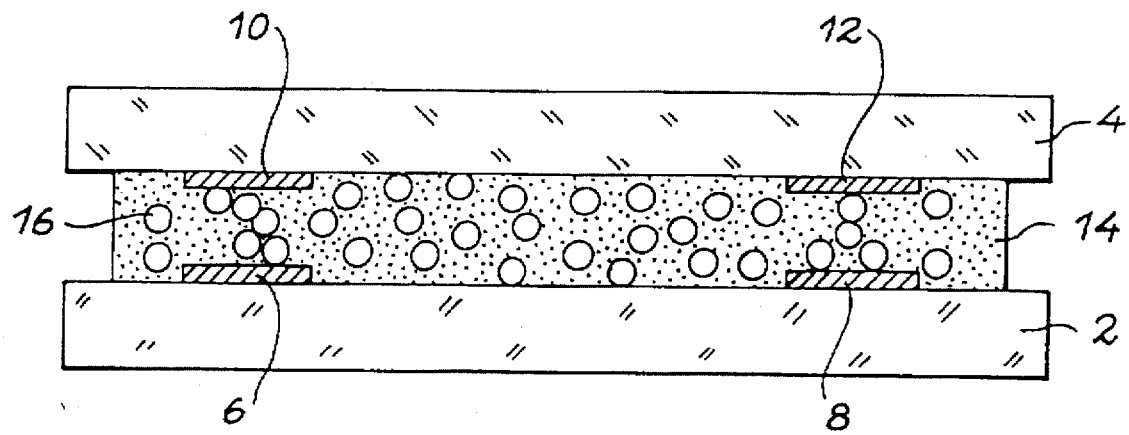
FIGS. 1 to 5, already described, prior art, anisotropic conductive film bonds.
Figure 2:
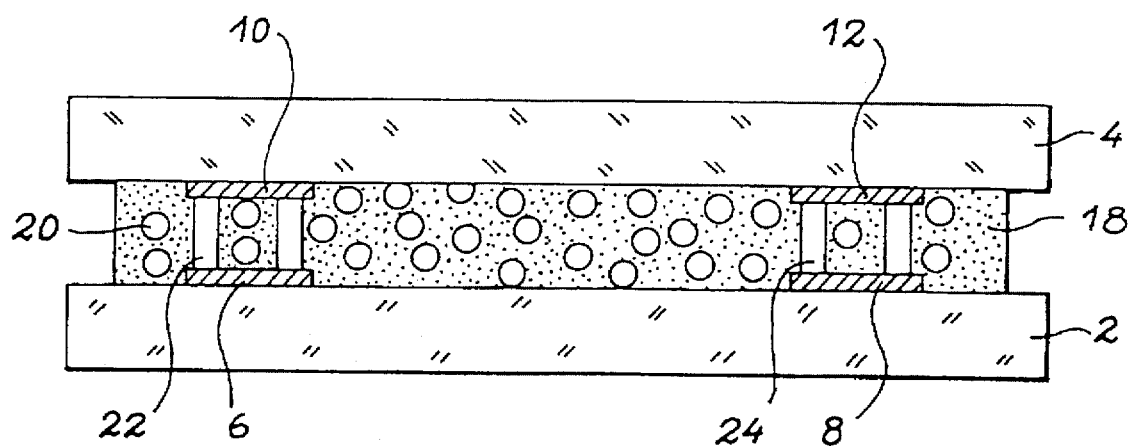
Figure 3:
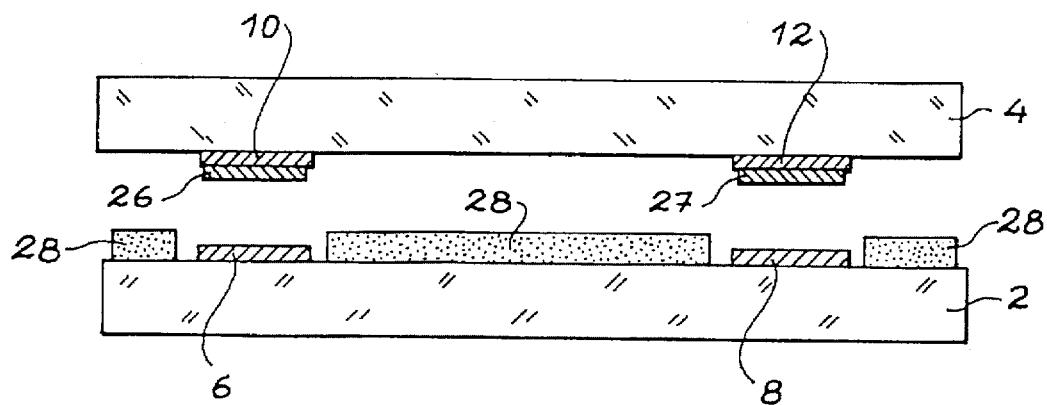
Figure 4:
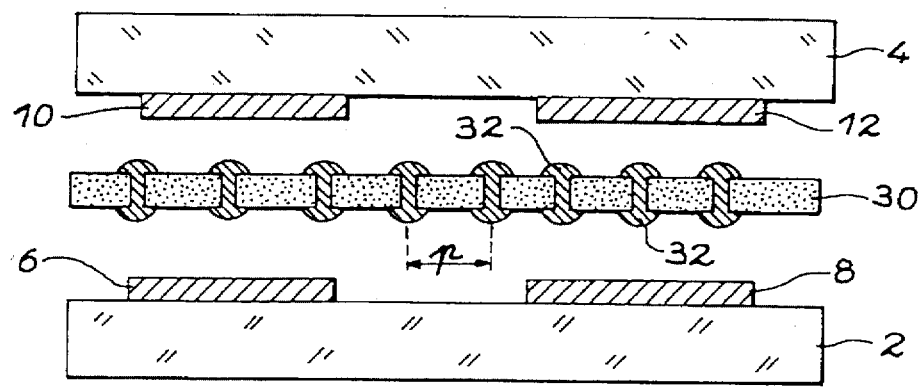
Figure 5:
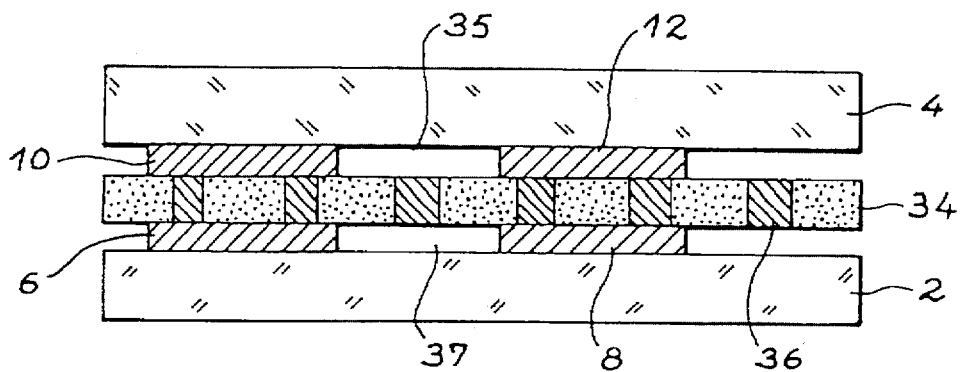
Figure 6A:
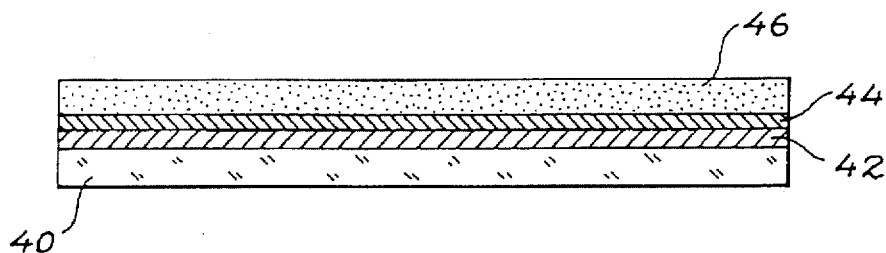
FIGS. 6a to 6f stages of a process for production of an anisotropic conductive film according to the invention.
Figure 6B:
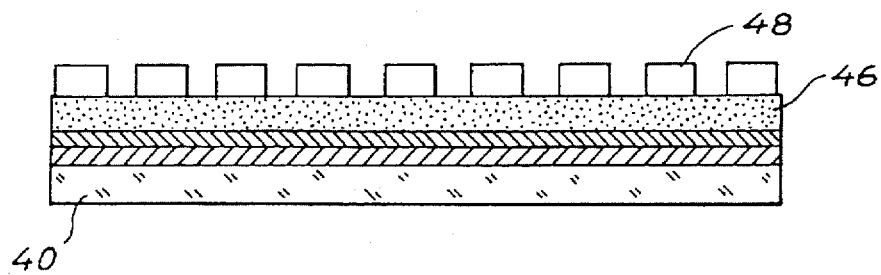
Figure 6C:
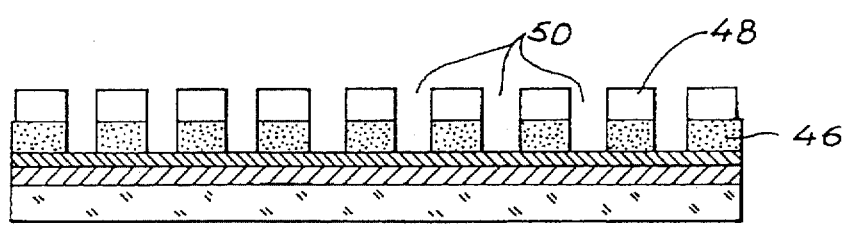
Figure 6D:
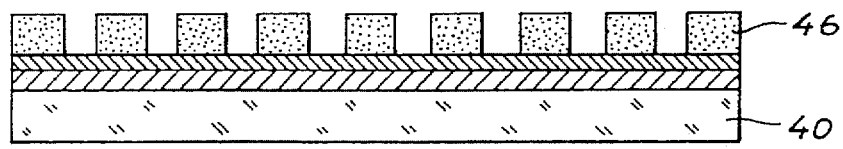
Figure 6E:
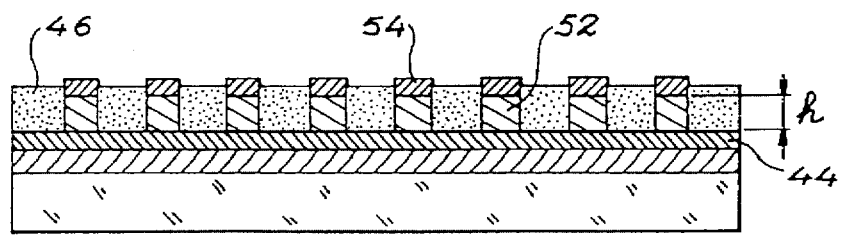
Figure 6F:
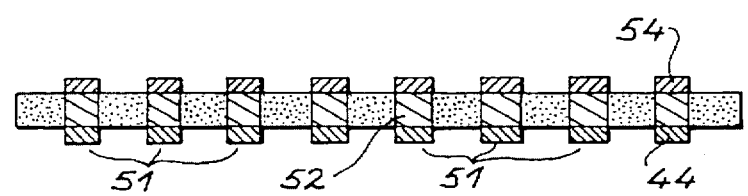

A process for the preparation of an anisotropic conductive film according to the invention is illustrated in FIGS. 6a to 6f.

In a first stage (FIG. 6a), deposition takes place on a substrate 40 of an attachment or bonding layer 42 of a first meltable material, said layer being e.g. constituted by TiNiAu, e.g. formed by cathodic sputtering or evaporation and having a thickness e.g. between 0.1 and 5 μm. On said layer 42 is deposited a layer of a first meltable material 44 and finally a polymer layer 46, e.g. of polyimide, a resin, a glue or a thermoplastic material. The layer 46 is advantageously partly annealed by making it undergo, e.g. in the case of a polyimide, a thermal pretreatment at 200° C. for 5 minutes. The layer 46 e.g. has a thickness of approximately 10 μm. If the meltable material can be directly attached to the substrate 40, it is then possible to avoid the deposition of the attachment layer 42.

A resin mask 48 (FIG. 6b), e.g. produced by lithography is then formed on the polymer layer 46. The polymer layer is then etched (FIG. 6c), so as to free holes 50 passing through the polymer layer 46. The mask 48 is then removed (FIG. 6d) and this is followed by the deposition (FIG. 6e) by electrolysis in the holes 50 of a hard material 52, e.g. copper or nickel or a meltable material at a high temperature such as SnPb(5–95). The hard material is such that it has a melting point higher than that of the first meltable material and preferably that used for producing the polymer and that used for the detachment of the film. Finally, deposition takes place on the hard material 52 of a second meltable material layer 54, once again by electrolysis. The electrolytic processes use as the electrode the underlying, continuous, first meltable material layer. Following the deposition of the layer 54, the assembly is heated to a temperature T equal to or higher than the melting point of the first meltable material. This leads on the one hand to a separation of the layer 42 and the parts of the first meltable material layer 44 not in contact with the hard material 52 and on the other hand the brazing of the meltable material 44 to the hard material 52.

Shrinkage can take place to the polymer 46 when the latter has not been completely annealed prior to separation and when the separating temperature exceeds the preannealing temperature.

The meltable materials can be of the same type, e.g. 60–40% SnPb, for the first and second meltable materials, and, for the hard and rigid part of the nail, 5–95% SnPb. The first material (60–40% SnPb) is a low temperature meltable material (180° C.) and the second material (5–95% SnPb) a high temperature meltable material (340° C.). In general terms, when the rigid part of the nail is made from a meltable material, it is e.g. a high temperature meltable material in such a way that its melting point exceeds the temperature T used for producing, by remelting the first meltable material, the separation of the layer 42 and the shrinkage of the polymer 46. This prevents, during the separation at temperature T, a tearing away of the rigid part of the nail and the appearance of openings in the film.

During the separation stage of the substrate 40, the hard material (e.g. Cu, Ni or, in the case described hereinbefore, 5-95% SnPb) is alloyed with meltable material portions 44 and optionally 54 with which it is in contact. This gives the nails 51, each nail having a hard central portion 52 and a meltable finish at its two ends. Moreover, on taking care, when correctly choosing the temperature T permitting the separation and the time during which heating takes place at said temperature T, not to exceed the temperature at which the polymer is completely polymerized, the latter retains a certain flexibility.

The film obtained is self-supporting and there is mechanical independence of the film with respect to any other structure, particularly with respect to the structures to be subsequently connected. The central portion made from hard material of the nails is embedded in the polymer and does not project.

Figure 7A:
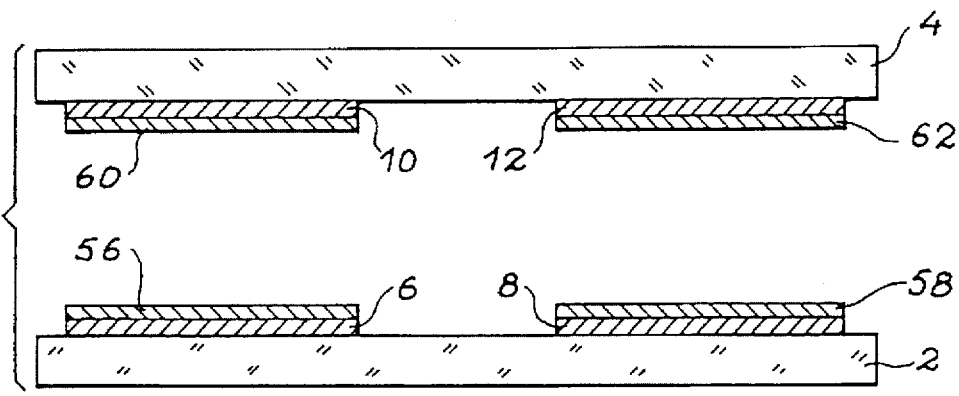
FIGS. 7a to 7c stages in the assembly of a chip on a substrate by means of an anisotropic conductive film according to the invention.

The assembly process for a substrate and a chip, both provided with contact pads, with the aid of an anisotropic conductive film as described hereinbefore will now be discussed. This process is illustrated, for certain of its stages, in FIGS. 7a to 7c. Thus, there is a substrate 2 provided with facing or aligned pads 6, 8 in front of the pads 10, 12 of a chip 4. These pads are e.g. of aluminium. It can be advantageous to cover these pads with attachment or bonding layers 56, 58, 60, 62 for brazing or attaching the meltable materials 44, 54. For example, it is possible, by using an "ELECTROLESS" process, to produce a Ni-Au or NiAg or NiSn or (CrCu)-Cu bi-layer, which conserve as a diffusion barrier and as a brazable material for the meltable materials 44, 54 of the nails 51. However, if the meltable materials 44, 54 can be directly brazed onto the pads, there is no need for such an attachment layer.

Figure 7B:
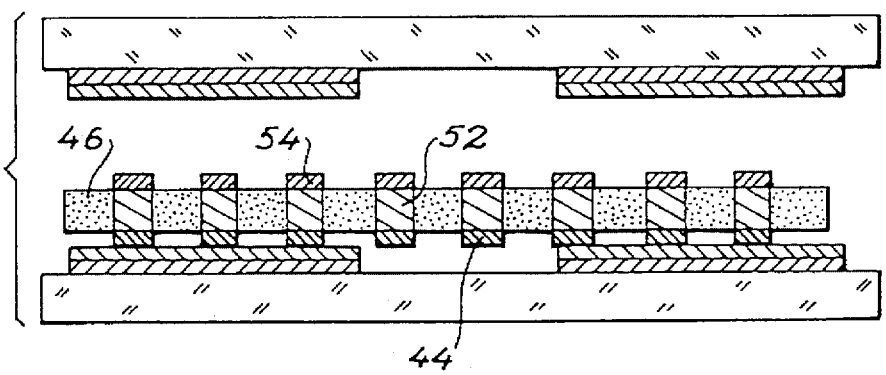

As illustrated in FIG. 7b, the two elements (substrate and chip) are then positioned facing one another, with the pads aligned or facing one another and between the two is placed an anisotropic conductive film like that described hereinbefore.

Figure 7C:
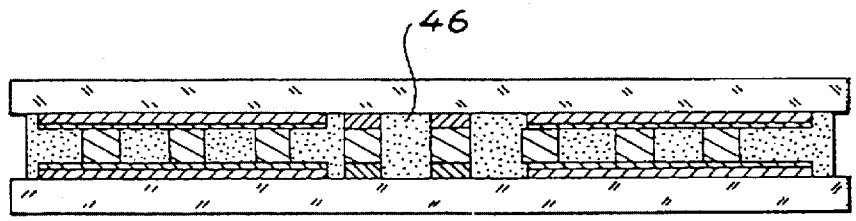

Finally, in FIG. 7c, the assembly is subjected to an assembly temperature equal to or higher than the melting points of the two meltable materials if the polymer has been previously completely polymerized, or the melting points of the two meltable materials and the final polymerization temperature of the polymer if the latter has not been previously completely polymerized.

The assembly temperature can e.g. be between 200° and 450° C., e.g. approximately 350° C.

Optionally, the assembly is subject to pressure action at e.g. between 0.1 and 10 kg/cm².

If the polymer was completely polymerized beforehand, this stage leads to a brazing of the meltable materials and to a compression of the pads. The meltable part of the nails, which is in contact with the attachment layer on the pads, is alloyed with the latter. This leads to a reduction in the height of the nails located between a chip pad and a substrate pad. This height is brought approximately to the height of the central portion of the hard material nail 52. For the other nails, which do not face an attachment metallurgy, said phenomenon does not occur.

Thus, an electrical connection is obtained by true brazing between a meltable material and a weldable surface.

If the polymer was not previously completely annealed or polymerized, this stage leads to the final polymerization of the polymer, to a brazing of the meltable materials, a compression of the pads and a bonding of the polymer material with the different surfaces. During assembly and under the effect of the temperature and optionally the pressure, the polymer, which is hitherto been incompletely annealed, creeps and can compensate the defects of reliefs of the pads. This also increases the contact surface between the polymer and the structures to be assembled and therefore improves the mechanical strength. The meltable part of the nails in contact with the attachment layer present on the pads is alloyed with the latter, which leads to a reduction in the height of the nails located between a chip pad and a substrate pad. This height is brought approximately to the height of the central portion of the hard material nail 52.

For the other nails, which do not face an attachment metallurgy, this phenomenon does not occur.

This brings about an electrical connection by a true brazing between a meltable material and a weldable surface. This connection has a very low electrical resistance of a few mΩ and a very high mechanical strength.

If the polymer is a thermoplastic material the assembly is reversible. It is merely necessary to heat the assembly to the softening point of the polymer and then separate the two parts.

According to an embodiment, the following characteristics were obtained:

diameter of nails 10 µm, spacing of the stamping of the nails 40 µm, materials used for the hard material of the nails copper or nickel and for the first and second meltable materials 60–40 SnPb, thickness of the initial polymer material 20 µm, after assembly 10 µm, nature of the polymer CEMOTA Syntorgip 305/20 (polyimide), deposition of the polyimide layer 46 on the first meltable material layer 44, with preannealing at 180° C. for 4 minutes, temperature T at which the layer 46 is debonded (FIG. 6e) T=230° C. for 30 seconds, deposition of an attachment layer on the chip and substrate pads to be interconnected of NiAu or (CrCu)-Cu, substrate-chip assembly conditions: temperature 350° C. for 20 minutes and then an optional pressure of 1 kg/cm².

It is generally possible to choose as the polymer a resin or a polymer glue or a polyimide.

Preferably, use is made of a polymer with the following properties:

slight shrinkage during final crosslinking, minimum solvent release during the temperature rise phases (annealing), annealing cycles adapted to the meltable materials used (particularly resistance of the polymer to high temperatures of up to 350° C.).

Polyimides have all these properties and consequently constitute a polymer type particularly suitable for the purposes of the invention.

In certain cases, it can be advantageous to coat with glue (or when the polymer is a polyimide a polyimide-solvent mixture) the polymer and/or the structures to be assembled in order to further improve the adhesion of the assembly.

I claim:

1. Self-supported, anisotropic conductive film having a polymer monolayer containing through holes, nail-shaped conductive elements filling said through holes, each of said conductive elements comprising a central portion, a first end and a second end, said central portion being constituted by a hard material and each end respectively by a first and second meltable materials.

2. Conductive film according to claim 1, the first and/or second meltable materials projecting on either side of the polymer layer.

3. Anisotropic conductive film according to claim 1, said two meltable materials being of identical composition.

4. Conductive film according to claim 1, the hard material being a meltable material.

5. Anisotropic conductive film according to claim 4, the hard material being copper or nickel.

6. Anisotropic conductive film according to claim 4, the meltable materials being SnPb.

7. Anisotropic conductive film according to claim 4, the through holes being spaced by between 3 and 500 μm.

8. Anisotropic conductive film according to claim 4, the diameter of the holes being between 1 and 100 μm.

9. Anisotropic conductive film according to claim 4, the thickness of the polymer layer being between 5 and 200 μm.

10. Anisotropic conductive film according to claim 4, the central portion of the nails being entirely in the polymer layer without projecting on either side thereof.

11. Anisotropic conductive film according to claim 4, the polymer layer being in the form of several layers.

12. Anisotropic conductive film according to claim 1, the hard material being copper or nickel.

13. Anisotropic conductive film according to claim 1, the meltable materials being SnPb.

14. Anisotropic conductive film according to claim 1, the through holes being spaced by between 3 and 500 μm.

15. Anisotropic conductive film according to claim 1, the diameter of the holes being between 1 and 100 μm.

16. Anisotropic conductive film according to claim 1, the thickness of the polymer layer being between 5 and 200 μm.

17. Anisotropic conductive film according to claim 1, the central portion being entirely in the polymer layer without projecting on either side thereof.

18. Self-supported, anisotropic conductive film having a polymer monolayer containing through holes, nail-shaped conductive elements filling said through holes, each of said conductive elements comprising a central portion, a first end and a second end, said central portion being constituted by a hard material deposited in one step and each end respectively by a first and second meltable materials.

19. Anisotropic conductive film according to claim 18, the first and/or second meltable materials projecting on either side of the polymer layer.

20. Anisotropic conductive film according to claim 18, said two meltable materials being of identical composition.

21. Anisotropic conductive film according to claim 18, the hard material being a meltable material.

22. Anisotropic conductive film according to claim 18, the hard material being copper or nickel.

23. Anisotropic conductive film according to claim 18, the meltable materials being SnPb.

24. Anisotropic conductive film according to claim 18, the through holes being spaced by between 3 and 500 μm.

25. Anisotropic conductive film according to claim 18, the diameter of the holes being between 1 and 100 μm.

26. Anisotropic conductive film according to claim 18, the thickness of the polymer monolayer being between 5 and 200 μm.

27. Anisotropic conductive film according to claim 18, the central portion being entirely in the polymer layer without projecting on either side thereof.

28. Self-supported, anisotropic conductive film having a polymer monolayer containing through holes, nail-shaped conductive elements filling said through holes, each of said conductive elements comprising a central portion, a first end and a second end, said central portion being constituted by a hard material and each end respectively by a first and second meltable materials, the hard material being such that it has a melting point higher than that of the first meltable material, and higher than the temperature used for producing the polymer and higher than the temperature used for the detachment of the film.

29. Anisotropic conductive film according to claim 28, the first and/or second meltable materials projecting on either side of the polymer layer.

30. Anisotropic conductive film according to claim 28, said two meltable materials being of identical composition.

31. Anisotropic conductive film according to claim 28, the hard material being a meltable material.

32. Anisotropic conductive film according to claim 28, the hard material being copper or nickel.

33. Anisotropic conductive film according to claim 28, the meltable materials being SnPb.

34. Anisotropic conductive film according to claim 28, the through holes being spaced by between 3 and 500 μm.

35. Anisotropic conductive film according to claim 28, the diameter of the holes being between 1 and 100 μm.

36. Anisotropic conductive film according to claim 28, the thickness of the polymer monolayer being between 5 and 200 μm.

37. Anisotropic conductive film according to claim 28, the central portion being entirely in the polymer layer without projecting on either side thereof.

* * * * *